(12) United States Patent
Lin et al.

(10) Patent No.: US 8,008,770 B2
(45) Date of Patent: Aug. 30, 2011

(54) INTEGRATED CIRCUIT PACKAGE SYSTEM WITH BUMP PAD

(75) Inventors: Yaojian Lin, Singapore (SG); Romeo Emmanuel P. Alvarez, Singapore (SG); Haijing Cao, Singapore (SG); Wan Lay Looi, Johor (MY)

(73) Assignee: Stats Chippac Ltd., Singapore (SG)

( * ) Notice: Subject to any disclaimer, the term of this patent is extended or adjusted under 35 U.S.C. 154(b) by 346 days.

(21) Appl. No.: 11/556,035

(22) Filed: Nov. 2, 2006

(65) Prior Publication Data
US 2007/0114639 A1   May 24, 2007

Related U.S. Application Data

(60) Provisional application No. 60/596,975, filed on Nov. 2, 2005.

(51) Int. Cl.
  *H01L 23/48* (2006.01)

(52) U.S. Cl. ... 257/738; 257/737; 257/681; 257/E23.01; 257/E23.021; 257/774

(58) Field of Classification Search ............... 257/738, 257/774, E23.021, 691, E23.01, 737
See application file for complete search history.

(56) References Cited

U.S. PATENT DOCUMENTS

| | | | |
|---|---|---|---|
| 5,554,940 A | 9/1996 | Hubacher | |
| 6,717,263 B2 * | 4/2004 | Sawai et al. | 257/737 |
| 6,756,671 B2 | 6/2004 | Lee et al. | |
| 6,939,789 B2 | 9/2005 | Huang et al. | |
| 2003/0214036 A1 * | 11/2003 | Sarihan et al. | 257/738 |
| 2004/0034489 A1 * | 2/2004 | Ogino et al. | 702/75 |
| 2005/0017355 A1 * | 1/2005 | Chou et al. | 257/738 |
| 2006/0073693 A1 | 4/2006 | Huang | |
| 2006/0214293 A1 * | 9/2006 | Park et al. | 257/738 |

* cited by examiner

*Primary Examiner* — Cuong Q Nguyen
*Assistant Examiner* — Trang Q Tran
(74) *Attorney, Agent, or Firm* — Mikio Ishimaru

(57) ABSTRACT

An integrated circuit package system includes an integrated circuit, and forming a patterned redistribution pad over the integrated circuit.

20 Claims, 5 Drawing Sheets

INTEGRATED CIRCUIT PACKAGE SYSTEM WITH BUMP PAD

CROSS-REFERENCE TO RELATED APPLICATION(S)

This application claims the benefit of U.S. Provisional Patent Application Ser. No. 60/596,975 filed Nov. 2, 2005.

TECHNICAL FIELD

The present invention relates generally to integrated circuit packages, and more particularly to integrated circuit package systems.

BACKGROUND ART

Integrated circuit density continues to be limited by the "real estate" available for mounting individual integrated circuits on a substrate. Even larger form factor systems, such as PC's, compute servers, and storage servers, need more integrated circuits in the same or smaller "real estate". Particularly acute, the needs for portable personal electronics, such as cell phones, digital cameras, music players, PDA's, and location-based devices, have further driven the need for integrated circuit density.

To this end, wafer level chip scale packages (WLCSPs) have been developed that are similar to the solder-bumped flip chip, except that the solder bumps on a WLCSP are much larger. The printed circuit board assembly of a WLCSP is more robust, and underfill encapsulants do not present a problem. WLCSP and flip chip manufacturing share common components and techniques, particularly solder bumping.

A flip chip microelectronic assembly includes a direct electrical connection of face down (that is, "flipped") electronic components onto substrates, such as ceramic substrates, circuit boards, or carriers using conductive bump bond pads of the chip. The flip chip components used in flip chip microelectronic assemblies are predominantly semiconductor devices, however, components such as passive filters, detector arrays, and MEM devices are being used in flip chip form. Flip chips are also known as "direct chip attach" because the chip is directly attached to the substrate, board, or carrier by the conductive bumps.

The use of flip chip packaging has dramatically grown because of the flip chip's advantages in size, performance, flexibility, reliability, and cost over other packaging methods and from the widening availability of flip chip materials, equipment, and services. In some cases, the elimination of old technology packages and bond wires may reduce the substrate or board area needed to secure the device by up to 25 percent, and may require far less height. Further, the weight of the flip chip can be less than 5 percent of the old technology package devices.

The bumps of the flip chip assembly serve several functions. The bumps provide an electrical conductive path from the chip (or die) to the substrate on which the chip is mounted. A thermally conductive path is also provided by the bumps to carry heat from the chip to the substrate. The bumps also provide part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Protective metallurgy layers may be provided over the bond pad. Ball limiting metallurgy (BLM) or under bump metallurgy (UBM) generally consists of successive layers. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A number of problems have arisen when reducing size but maintaining big bumps on redistribution layers for wafer level chip scale packages including early failures.

Thus, a need still remains for an integrated circuit package system to provide improved stability and small isolated feature deposition. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit substrate, and forming a patterned redistribution pad over the integrated circuit substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
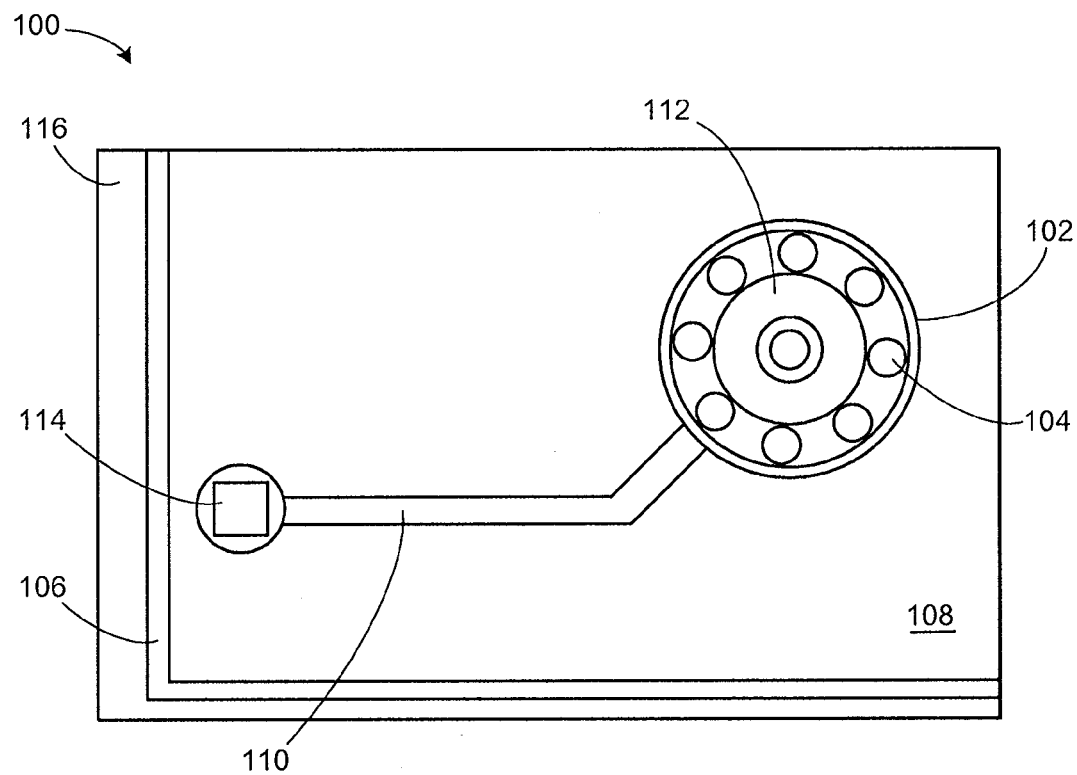
FIG. 1 is a top plan view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on" "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes stamping, forging, patterning, exposure, development, etching, cleaning, and/or removal of the material or laser trimming as required in forming a described structure. The term "system" as used herein means and refers to the method and to the apparatus of the present invention in accordance with the context in which the term is used.

Referring now to FIG. 1, therein is shown a top plan view of an integrated circuit package system 100 in an embodiment of the present invention. The integrated circuit package system 100 includes a patterned redistribution pad 102, such as a bump pad, having patterned redistribution pad openings 104. The patterned redistribution pad openings 104 can optionally be in the shape of a circle for improved stress distribution and process capability. The patterned redistribution pad openings 104 are formed through the patterned redistribution pad 102 and formed along a perimeter of the patterned redistribution pad. The patterned redistribution pad openings 104 of the patterned redistribution pad 102 are formed over a first insulating layer 106, such as a first polyimide layer (PI-1). A solid material such as a second insulating layer 108, such as a second polyimide layer (PI-2), is formed over the patterned redistribution pad 102 and a redistribution trace 110 and can fill the patterned redistribution pad openings 104 with solid material. The second insulating layer 108 includes a second insulating layer opening 112, such as a trench or via.

The redistribution trace 110 connects the patterned redistribution pad 102 to an integrated circuit pad 114. The integrated circuit pad 114 is formed over an integrated circuit 116 such as an integrated circuit wafer. The second insulating layer 108, the patterned redistribution pad 102, the redistribution trace 110, and the first insulating layer 106 over the integrated circuit 116, provide a package for the integrated circuit 116.

For illustrative purposes, the patterned redistribution pad openings 104 are shown in the shape of a circle although it is understood that any shape may be used. Further, for illustrative purposes, nine of the patterned redistribution pad openings 104 are shown although it is understood that any number of the patterned redistribution pad openings 104 may be used. Yet further, the patterned redistribution pad 102, the patterned redistribution pad openings 104, and the second insulating layer opening 112 may be of any size or shape.

It has been unexpectedly discovered that the patterned redistribution pad openings 104 provide release for the outgassing of the first insulating layer 106 during processing. Further, it has been unexpectedly discovered that the release reduces stress concentration at the patterned redistribution pad 102 providing improved adhesion between the patterned redistribution pad 102 and the first insulating layer 106.

Figure 2:
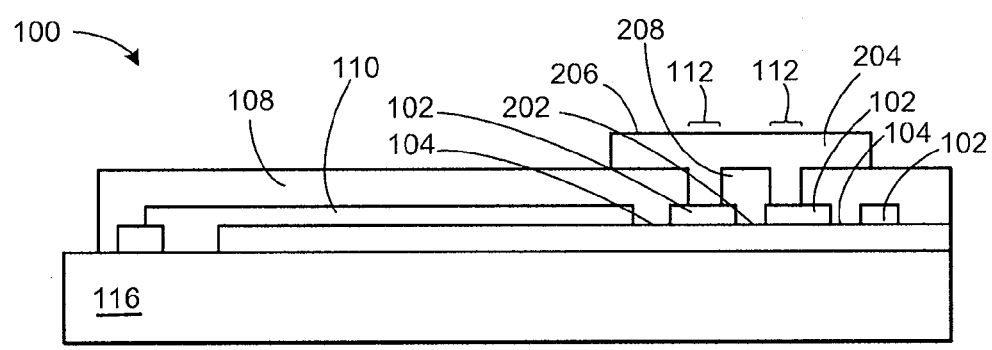
FIG. 2 is a cross-sectional view of the integrated circuit package system.

Referring now to FIG. 2, therein is shown a cross-sectional view of the integrated circuit package system 100. The integrated circuit package system 100 optionally includes a patterned redistribution pad center opening 202. The patterned redistribution pad center opening 202 can be formed in the patterned redistribution pad 102. A solid material such as the second insulating layer island 208 can optionally be formed over the patterned redistribution pad center opening 202 and can fill the patterned redistribution pad center opening 202. Dimensions of the patterned redistribution pad center opening 202 can optionally be determined by dimensions of the patterned redistribution pad 102. Similarly, dimensions of the patterned redistribution pad 102 can be used to determine whether the patterned redistribution pad 102 be formed without the patterned redistribution pad center opening 202.

As an option, the second insulating layer opening 112 can be formed in the shape of a trench surrounding the patterned redistribution pad center opening 202, such as the second insulating layer, 108 formed in the shape an island over the patterned redistribution pad center opening 202. As another option, the second insulating layer opening 112 can be formed in the shape of a via without the need for an island of the second insulating layer 108 formed over the patterned redistribution pad center opening 202.

A solid material forms an under bump layer 204, such as an under bump metallization (UBM), that includes a conductive material and is formed over the second insulating layer 108, the patterned redistribution pad 102, the first insulating layer 106, and the integrated circuit 116. The under bump layer 204 provides a connection surface 206 for a conductive bump (not shown), such as a solder bump. Connecting the conductive bump results in stress on the connection surface 206 of the under bump layer 204. The conductive bump can be connected to a next level system (not shown), such as a printed circuit board, providing electrical connectivity to the integrated circuit 116.

It has been unexpectedly discovered that the second insulating layer opening 112 formed as a trench provides improved planarization on top of the patterned redistribution pad 102 resulting in even distribution of stress for the under bump layer 204 and improved reliability of the conductive bump for big bump redistribution layers (RDL). Further, it has been unexpectedly discovered that the second insulating layer opening 112 formed as a via provides anchoring of the under bump layer 204 resulting in even distribution of stress for the under bump layer 204 and improved reliability of the conductive bump for big bump redistribution layers (RDL).

Figure 3:
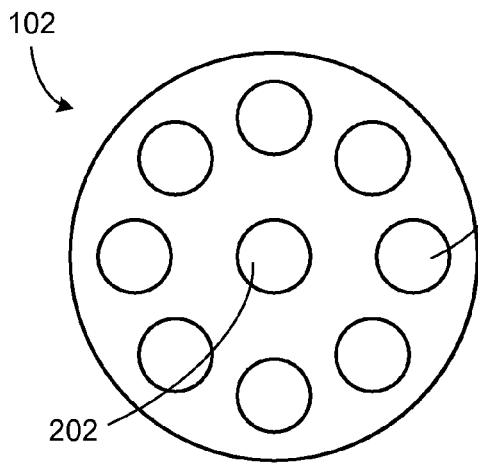
FIG. 3 is a top view of the patterned redistribution pad.

Referring now to FIG. 3, therein is shown a top view of the patterned redistribution pad 102. The patterned redistribution pad 102 is in the shape of a circle or oval. The patterned redistribution pad openings 104 in the shape of a circle or oval provide improved stress distribution and process capability. The patterned redistribution pad 102 can also include the patterned redistribution pad center opening 202. The patterned redistribution pad center opening 202 is optional depending on dimensions of the patterned redistribution pad 102.

Figure 4:
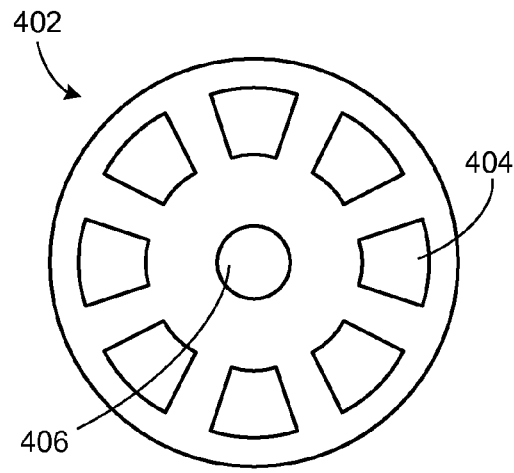
FIG. 4 is a top view of a patterned redistribution pad in an alternative embodiment of the present invention.

Referring now to FIG. 4, therein is shown a top view of a patterned redistribution pad 402 in an alternative embodiment of the present invention. The patterned redistribution pad 402 is in the shape of a circle or oval. Patterned redistribution pad openings 404 resulting in a shape of spokes around the patterned redistribution pad 402 provide improved inward stress distribution and process capability. The patterned redistribution pad 402 can also include a patterned redistribution pad center opening 406. The patterned redistribution pad center opening 406 is optional depending on dimensions of the patterned redistribution pad 402.

Figure 5:
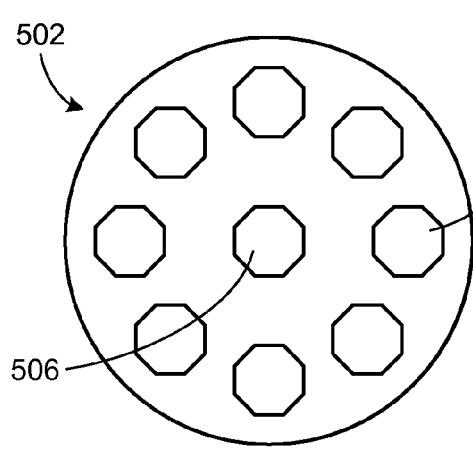
FIG. 5 is a top view of a patterned redistribution pad in another alternative embodiment.

Referring now to FIG. 5, therein is shown a top view of a patterned redistribution pad 502 in another alternative embodiment. The patterned redistribution pad 502 is in the shape of a circle or oval. Patterned redistribution pad openings 504 in the shape of an octagon or hexagon provide improved stress distribution and process capability. The patterned redistribution pad 502 can also include a patterned redistribution pad center opening 506. The patterned redistribution pad center opening 506 is optional depending on dimensions of the patterned redistribution pad 502.

Figure 6:
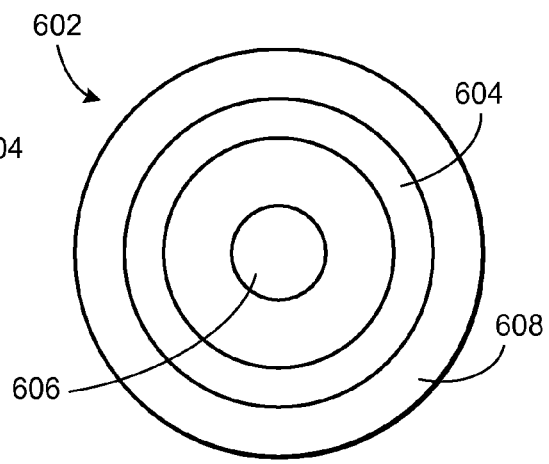
FIG. 6 is a top view of a patterned redistribution pad in yet another alternative embodiment.

Referring now to FIG. 6, therein is shown a top view of a patterned redistribution pad 602 in yet another alternative embodiment. The patterned redistribution pad 602 is in the shape of a circle or oval. Patterned redistribution pad openings 604 in the shape of a trench provide improved stress distribution and process capability. The patterned redistribution pad 602 can also include a patterned redistribution pad center opening 606. The patterned redistribution pad center opening 606 is optional depending on dimensions of the patterned redistribution pad 602. An outside ring 608 is not required and can act as a dummy structure.

Figure 7:
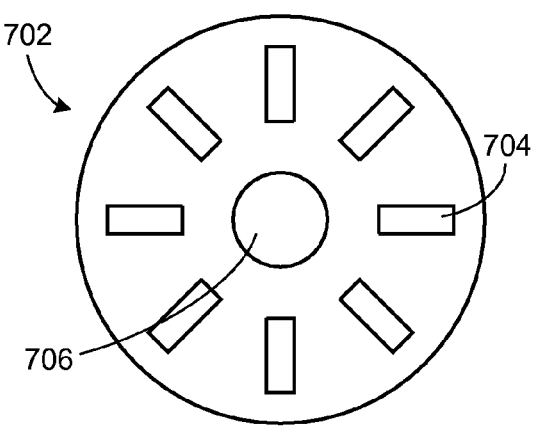
FIG. 7 is a top view of a patterned redistribution pad in yet another alternative embodiment.

Referring now to FIG. 7, therein is shown a top view of a patterned redistribution pad 702 in yet another alternative embodiment. The patterned redistribution pad 702 is in the shape of a circle or oval. Patterned redistribution pad openings 704 in the shape of rectangles provide improved outward stress distribution and process capability. The patterned redistribution pad 702 can also include a patterned redistribution pad center opening 706. The patterned redistribution pad center opening 706 is optional depending on dimensions of the patterned redistribution pad 702.

Figure 8:
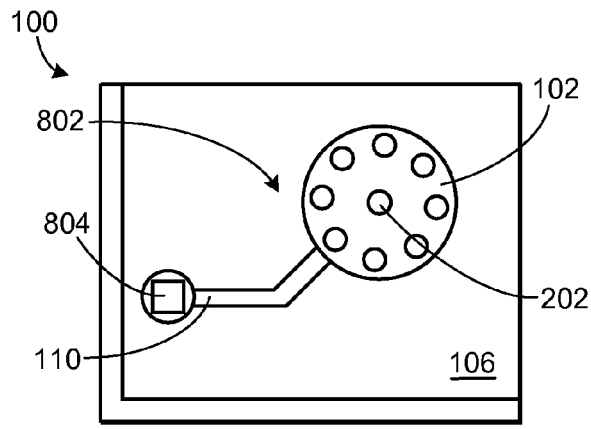
FIG. 8 is a plan view of the integrated circuit package system in a redistribution forming phase.

Referring now to FIG. 8, therein is shown a plan view of the integrated circuit package system 100 in a redistribution forming phase. The integrated circuit package system 100 includes a redistribution layer 802. The redistribution layer 802 is formed, such as lithography and curing, over the first insulating layer 106. The redistribution layer 802 includes the patterned redistribution pad 102 and the redistribution trace 110. The redistribution trace 110 connects the patterned redistribution pad 102 to an integrated circuit connector 804, such as an integrated circuit bond pad. The integrated circuit connector 804 provides electrical connectivity to an integrated circuit die (not shown). The patterned redistribution pad center opening 202 can optionally be formed in the patterned redistribution pad 102.

Figure 9:
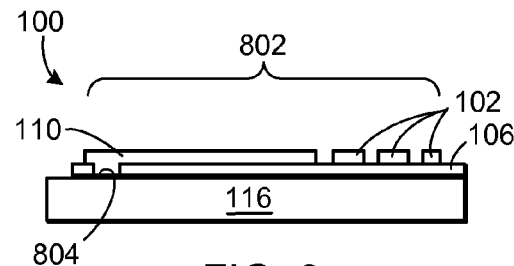
FIG. 9 is a cross-sectional view of the integrated circuit package system in the redistribution forming phase.

Referring now to FIG. 9, therein is shown a cross-sectional view of the integrated circuit package system 100 in the redistribution forming phase. The integrated circuit package system 100 includes the patterned redistribution pad 102. The first insulating layer 106 is formed over the integrated circuit 116 and protects circuitry (not shown) of the integrated circuit die. The redistribution layer 802, including the patterned redistribution pad 102 and the redistribution trace 110, is formed over the first insulating layer 106 to provide connectivity between the integrated circuit connector 804 of the integrated circuit die and the patterned redistribution pad 102.

Figure 10:
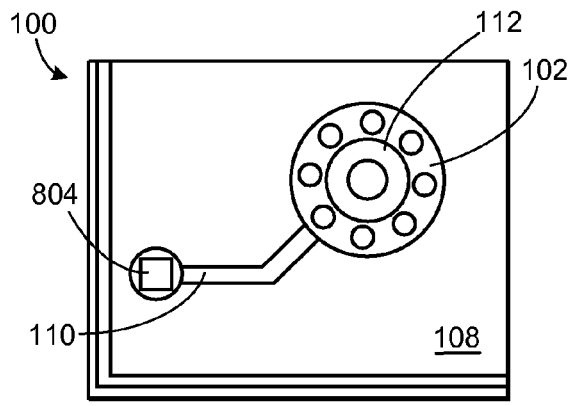
FIG. 10 is a plan view of the integrated circuit package system in a second insulation forming phase.

Referring now to FIG. 10, therein is shown a plan view of the integrated circuit package system 100 in a second insulation forming phase. The integrated circuit package system 100 includes the second insulating layer opening 112. The second insulating layer opening 112 provides electrical connectivity to the patterned redistribution pad 102. The patterned redistribution pad 102 in turn provides electrical connectivity through the redistribution trace 110 to the integrated circuit connector 804 of the integrated circuit die. The second insulating layer 108 is formed, such as lithography and curing, over the redistribution layer 802 and provides protection for the redistribution trace 110 and a portion of the patterned redistribution pad 102.

Figure 11:
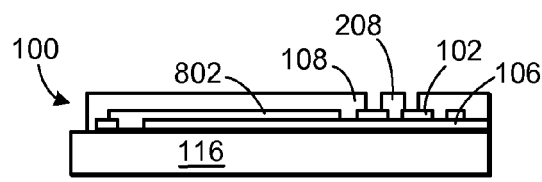
FIG. 11 is a cross-sectional view of the integrated circuit package system in the second insulation forming phase.

Referring now to FIG. 11, therein is shown a cross-sectional view of the integrated circuit package system 100 in the second insulation forming phase. The second insulating layer 108 is formed over the redistribution layer 802, a portion of the first insulating layer 106, and a portion of the integrated circuit 116. The second insulating layer 108 is formed in the shape of a trench around the second insulating layer island 208 and over an exposed portion of the patterned redistribution pad 102. The exposed portion of the patterned redistribution pad 102, surrounded by the second insulating layer 108 in the shape of a trench, provides connectivity to the redistribution layer 802.

Figure 12:
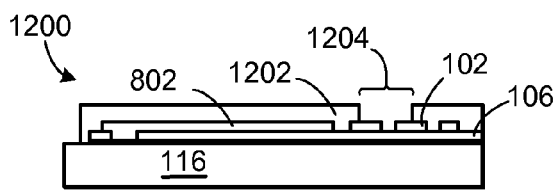
FIG. 12 is a cross-sectional view of an integrated circuit package system in yet another alternative embodiment of the present invention.

Referring now to FIG. 12, therein is shown a cross-sectional view of an integrated circuit package system 1200 in yet another alternative embodiment of the present invention. The integrated circuit package system 1200 is shown in an insulation forming phase. A second insulating layer 1202 is formed over the redistribution layer 802, a portion of the first insulating layer 106, and a portion of the integrated circuit 116. The second insulating layer 1202 is formed with a second insulating layer opening 1204 in the shape of a via over an exposed portion of the patterned redistribution pad 102. The exposed portion of the patterned redistribution pad 102, surrounded by the second insulating layer 1202 in the shape of a via, provides connectivity to the redistribution layer 802.

Figure 13:
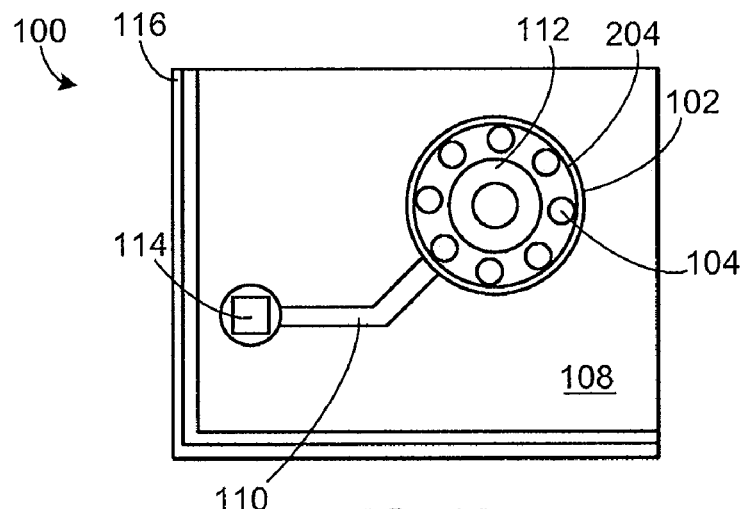
FIG. 13 is a plan view of the integrated circuit package system in an under bump layer forming phase.

Referring now to FIG. 13, therein is shown a plan view of the integrated circuit package system 100 in an under bump layer forming phase. The under bump layer 204 is formed, such as sputtering and patterning, over the patterned redistribution pad 102. The second insulating layer opening 112 provides an exposed portion of the patterned redistribution pad 102 for connectivity of the under bump layer 204. The redistribution trace 110 connects the patterned redistribution pad 102 to the integrated circuit pad 114. The patterned redistribution pad openings 104 provide improved stress distribution and process capability for the under bump layer 204.

Figure 14:
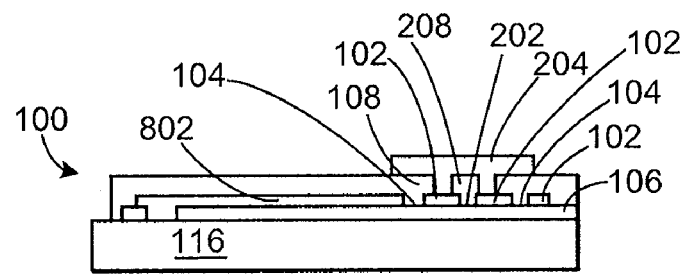
FIG. 14 is a cross-sectional view of the integrated circuit package system in the under bump layer forming phase.

Referring now to FIG. 14, therein is shown a cross-sectional view of the integrated circuit package system 100 in the under bump layer forming phase. The under bump layer 204 is formed over the second insulating layer 108, the redistribution layer 802, the first insulating layer 106, and the integrated circuit 116. A portion of the under bump layer 204 is applied over the second insulating layer 108 formed in the shape of a trench around the second insulating layer island 208 and over an exposed portion of the patterned redistribution pad 102.

Figure 15:
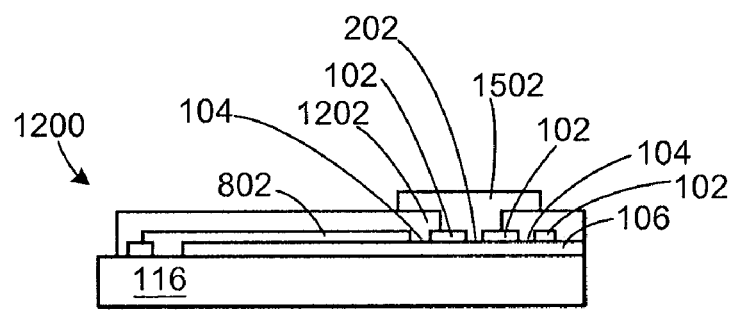
FIG. 15 is a cross-sectional view of the integrated circuit package system in an under bump layer forming phase.

Referring now to FIG. 15, therein is shown a cross-sectional view of the integrated circuit package system 1200 in an under bump layer forming phase. An under bump layer 1502 is formed over the second insulating layer 1202, the redistribution layer 802, the first insulating layer 106, and the integrated circuit 116. A portion of the under bump layer 1502 is applied over the second insulating layer 1202 formed in the shape of a via over an exposed portion of the patterned redistribution pad 102 and fills a patterned redistribution pad opening such as patterned redistribution pad center opening 202 with a solid and conductive material.

Figure 16:
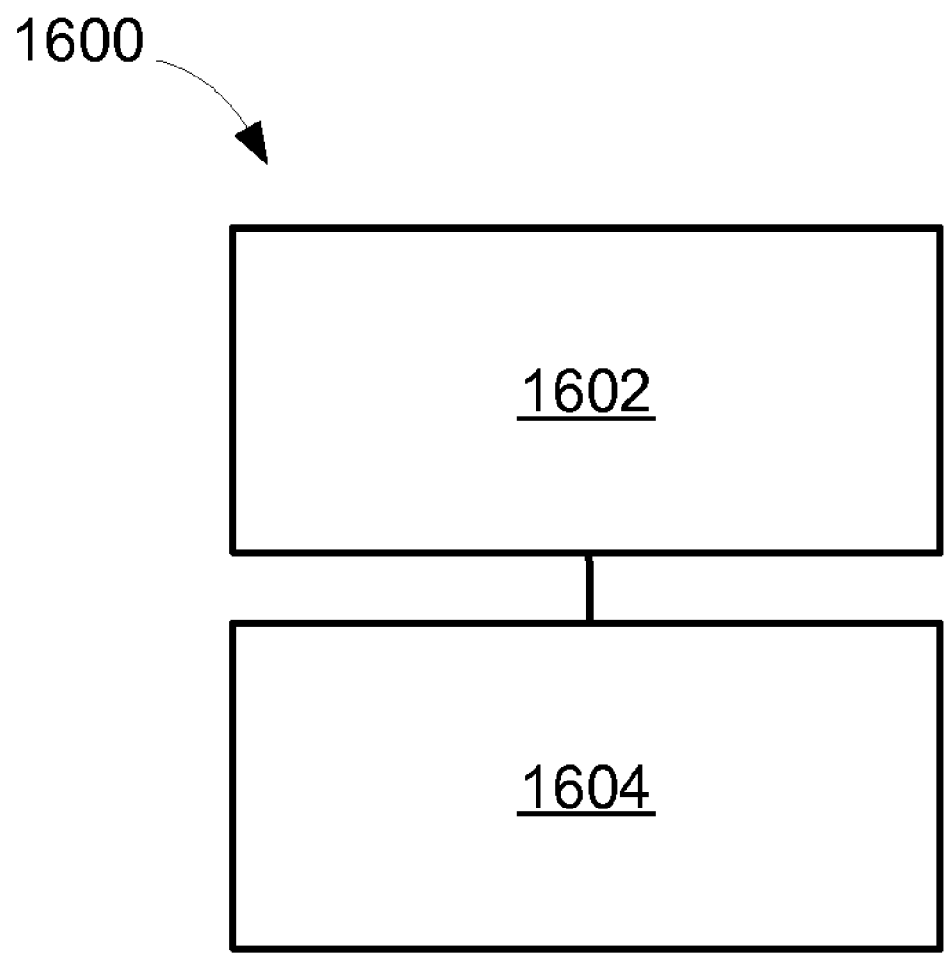
FIG. 16 is a flow chart of an integrated circuit package system for manufacturing the integrated circuit package system in an embodiment of the present invention.

Referring now to FIG. 16, therein is shown a flow chart of an integrated circuit package system 1600 for manufacturing the integrated circuit package system 100 in an embodiment of the present invention. The system 1600 includes providing an integrated circuit in a block 1602; and forming a patterned redistribution pad over the integrated circuit in a block 1604.

In greater detail, a system to provide the method and apparatus of the integrated circuit package system 100, in an embodiment of the present invention, is performed as follows:

1. Providing an integrated circuit wafer.
2. Forming a redistribution layer having a patterned redistribution pad and a redistribution trace.
3. Applying an under bump layer over the patterned redistribution pad.

It has been discovered that the present invention thus has numerous aspects.

An aspect is that the present invention provides the patterned redistribution pad openings. The patterned redistribution pad includes the patterned redistribution pad openings. The patterned redistribution pad openings can be of any pattern or shape.

Another aspect is that the present invention provides an option of the patterned redistribution pad center opening. Based on dimensions of the patterned redistribution pad, the patterned redistribution pad center opening can be included.

Yet another important aspect is that the present invention provides the second insulating layer opening. The second insulating layer can include the second insulating layer opening. The second insulating layer opening can be of any pattern or shape.

Yet another important aspect is that the present invention provides an option of the second insulating layer island. The second insulating layer can include the second insulating layer island.

It has been discovered that the disclosed structure provides release for the outgassing of the first insulating layer during processing. The patterned redistribution pad openings and optionally the patterned redistribution pad center opening provide an outlet for the outgassing.

It has also been discovered that the disclosed structure provides reduced stress concentration at the patterned redistribution pad providing improved adhesion between the patterned redistribution pad and the first insulating layer.

Another discovery is that that the disclosed structure provides improved planarization on top of the patterned redistribution pad resulting in even distribution of stress for the under bump layer and improved reliability of the conductive bump for big bump redistribution layers.

Yet another discovery is that the disclosed structure provides anchoring of the under bump layer resulting in even distribution of stress for the under bump layer and improved reliability of the conductive bump for big bump redistribution layers.

Yet another discovery of the disclosed structure is compatibility with high volume wafer-level methods and apparatus. The integrated circuit package system provides improved stress distribution and process capability.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system, method, and apparatus, of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hitherto set forth herein or shown in the accompanying drawings are to be interpreted in an illustrative and non-limiting sense.

What is claimed is:

1. An integrated circuit package system comprising:
   providing an integrated circuit;
   forming a patterned redistribution pad over the integrated circuit, the patterned redistribution pad including patterned redistribution pad openings along a perimeter of and through the patterned redistribution pad wherein the pattern redistribution pad is conductive: and
   filling the patterned redistribution pad openings with a solid material wherein the solid material is conductive.

2. The system as claimed in claim 1 wherein filling the patterned redistribution pad openings with the solid material includes filling at least one patterned redistribution pad opening with a conductive material.

3. The system as claimed in claim 1 wherein forming the patterned redistribution pad includes forming a patterned redistribution pad center opening.

4. The system as claimed in claim 1 further comprising forming an insulating layer opening over the patterned redistribution pad.

5. The system as claimed in claim 1 further comprising forming an insulating layer island over the patterned redistribution pad.

6. An integrated circuit package system comprising:
   providing an integrated circuit wafer;
   forming a redistribution layer over the integrated circuit wafer having a redistribution trace and a patterned redistribution pad, the patterned redistribution pad including patterned redistribution pad openings along a perimeter of and through the patterned redistribution pad wherein the pattern redistribution pad is conductive:
   filling the patterned redistribution pad openings with a solid material wherein the solid material is conductive; and applying an under bump layer over the patterned redistribution pad.

7. The system as claimed in claim 6 wherein forming the redistribution layer includes forming patterned redistribution pad openings in a shape of an oval.

8. The system as claimed in claim 6 wherein forming the redistribution layer includes forming patterned redistribution pad openings with the patterned redistribution pad having a shape of a spoke.

9. The system as claimed in claim 6 wherein forming the redistribution layer includes forming patterned redistribution pad openings in a shape of a polygon.

10. The system as claimed in claim 6 wherein forming the redistribution layer includes forming patterned redistribution pad openings in a shape of a trench.

11. An integrated circuit package system comprising:
an integrated circuit; and
a patterned redistribution pad over the integrated circuit, the patterned redistribution pad including patterned redistribution pad openings along a perimeter of and through the patterned redistribution pad wherein the pattern redistribution pad is conductive and the patterned redistribution pad openings filled with a solid material wherein the solid material is conductive.

12. The system as claimed in claim 11 wherein at least one patterned redistribution pad opening is filled with a conductive material.

13. The system as claimed in claim 11 wherein the patterned redistribution pad includes a patterned redistribution pad center opening.

14. The system as claimed in claim 11 further comprising an insulating layer opening over the patterned redistribution pad.

15. The system as claimed in claim 11 further comprising an insulating layer island over the patterned redistribution pad.

16. The system as claimed in claim 11 wherein:
the integrated circuit is an integrated circuit wafer;
the patterned redistribution pad is a redistribution layer having the patterned redistribution pad and a redistribution trace over the integrated circuit wafer; and further comprising:
an under bump layer over the patterned redistribution pad.

17. The system as claimed in claim 16 wherein the redistribution layer includes patterned redistribution pad openings in a shape of an oval.

18. The system as claimed in claim 16 wherein the redistribution layer includes patterned redistribution pad openings with the patterned redistribution pad having a shape of a spoke.

19. The system as claimed in claim 16 wherein the redistribution layer includes patterned redistribution pad openings in a shape of a polygon.

20. The system as claimed in claim 16 wherein the redistribution layer includes patterned redistribution pad openings in a shape of a trench.

* * * * *

UNITED STATES PATENT AND TRADEMARK OFFICE
CERTIFICATE OF CORRECTION

PATENT NO.        : 8,008,770 B2                                              Page 1 of 1
APPLICATION NO.   : 11/556035
DATED             : August 30, 2011
INVENTOR(S)       : Lin et al.

It is certified that error appears in the above-identified patent and that said Letters Patent is hereby corrected as shown below:

In the Claims:

Column 8, Claim 1, line 41, delete "conductive: and" and insert therefor -- conductive; and --

Column 8, Claim 6, line 64, delete "conductive:" and insert therefor -- conductive; --

Signed and Sealed this
Twenty-first Day of April, 2015

Michelle K. Lee
*Director of the United States Patent and Trademark Office*